United States Patent

Iwasa et al.

[11] Patent Number: 5,969,396
[45] Date of Patent: Oct. 19, 1999

[54] SEMICONDUCTOR DEVICE AND METHOD OF FABRICATING THE SAME

[75] Inventors: Takayuki Iwasa, Yamato; Masaki Funaki, Yokohama, both of Japan

[73] Assignee: Victor Company of Japan, Ltd., Yokohama, Japan

[21] Appl. No.: 09/190,267

[22] Filed: Nov. 13, 1998

[30] Foreign Application Priority Data

Nov. 28, 1997 [JP] Japan .................................. 9-344519

[51] Int. Cl.⁶ ........................................................ H01L 29/76
[52] U.S. Cl. ........................ 257/408; 257/336; 257/344; 257/401
[58] Field of Search ................................... 257/336, 337, 257/344, 408, 401; 438/301–306

[56] References Cited

U.S. PATENT DOCUMENTS 5,164,806  11/1992  Nagatomo et al. ...................... 257/408
5,831,317  11/1998  Shimazaki ................................ 257/408

FOREIGN PATENT DOCUMENTS

5-102181  4/1993  Japan .
5-93922   4/1993  Japan .
9-69628   3/1997  Japan .

*Primary Examiner*—Tom Thomas
*Assistant Examiner*—Ori Nadav
*Attorney, Agent, or Firm*—Pollock, Vande Sande & Amernick

[57] ABSTRACT

A semiconductor device includes a semiconductor substrate. A gate electrode is formed on the semiconductor substrate. A drain region is formed on the semiconductor substrate. An element separating region is formed on the semiconductor substrate. The drain region includes a heavily doped region and a lightly doped region. The heavily doped region is higher in impurity concentration than the lightly doped region. The lightly doped region has a first portion extending between the gate electrode and the heavily doped region. The lightly doped region has a second portion extending between the element separating region and the heavily doped region.

8 Claims, 5 Drawing Sheets

SEMICONDUCTOR DEVICE AND METHOD OF FABRICATING THE SAME

BACKGROUND OF THE INVENTION

1. Field of the Invention

This invention relates to a semiconductor device such as a MOS transistor (a metal oxide semiconductor field-effect transistor). This invention also relates to a method of fabricating a semiconductor device.

2. Description of the Related Art

In MOS transistors (metal oxide semiconductor field-effect transistors) formed on silicon substrates, hot carriers decrease transistor performances. An LDD (lightly doped drain) structure is effective in suppressing or preventing hot-carriers-caused decreases in transistor performances.

Japanese published unexamined patent application 9-69628 discloses a MOS transistor having such an LDD structure. The MOS transistor in Japanese application 9-69628 tends to be unreliable during operation at a high drive voltage. In addition, the MOS transistor in Japanese application 9-69628 tends to be unable to withstand a high drive voltage.

Japanese published unexamined patent application 5-93922 discloses a MOS transistor having a drift channel structure. The drift channel structure enables the MOS transistor to withstand a high drive voltage. The MOS transistor in Japanese application 5-93922 tends to be large in size.

SUMMARY OF THE INVENTION

It is a first object of this invention to provide a semiconductor device which withstands a high drive voltage.

It is a second object of this invention to provide a small-sized semiconductor device.

It is a third object of this invention to provide a method of fabricating an improved semiconductor device.

A first aspect of this invention provides a semiconductor device comprising a semiconductor substrate; a gate electrode formed on the semiconductor substrate; a drain region formed on the semiconductor substrate; and an element separating region formed on the semiconductor substrate; wherein the drain region includes a heavily doped region and a lightly doped region, the heavily doped region being higher in impurity concentration than the lightly doped region, the lightly doped region having a first portion extending between the gate electrode and the heavily doped region, the lightly doped region having a second portion extending between the element separating region and the heavily doped region.

A second aspect of this invention is based on the first aspect thereof, and provides a semiconductor device wherein the first portion of the lightly doped region and the second portion of the lightly doped region are different in length.

A third aspect of this invention is based on the first aspect thereof, and provides a semiconductor device wherein the first portion of the lightly doped region has a constricted portion which provides a shortened dimension of overlap between the gate electrode and the lightly doped region.

A fourth aspect of this invention provides a semiconductor device comprising a semiconductor substrate; a gate electrode formed on the semiconductor substrate; a source region formed on the semiconductor substrate; and an element separating region formed on the semiconductor substrate; wherein the source region includes a heavily doped region and a lightly doped region, the heavily doped region being higher in impurity concentration than the lightly doped region, the lightly doped region having a first portion extending between the gate electrode and the heavily doped region, the lightly doped region having a second portion extending between the element separating region and the heavily doped region.

A fifth aspect of this invention is based on the fourth aspect thereof, and provides a semiconductor device wherein the first portion of the lightly doped region and the second portion of the lightly doped region are different in length.

A sixth aspect of this invention is based on the fourth aspect thereof, and provides a semiconductor device wherein the first portion of the lightly doped region has a constricted portion which provides a shortened dimension of overlap between the gate electrode and the lightly doped region.

A seventh aspect of this invention provides a method of fabricating a semiconductor device which comprises the steps of forming a well region of a first conductivity type in a semiconductor substrate; forming an element-separating field oxide film on an area of the semiconductor substrate which extends along an edge of the well region; forming a gate oxide film on the well region; forming a gate electrode on the gate oxide film; implanting impurity ions into portions of the well region and forming first and second lightly doped regions of a second conductivity type therein while using the gate electrode and the element-separating field oxide film as masks, the second conductivity type being opposite to the first conductivity type; forming a resist of a predetermined pattern on the gate electrode, the gate oxide film, and the element-separating field oxide film; and implanting impurity ions into a portion of the first lightly doped region and a portion of the second lightly doped region and changing the portion of the first lightly doped region and the portion of the second lightly doped region into a first heavily doped region and a second heavily doped region respectively while using the resist as a mask, the first and second heavily doped regions being of the second conductivity type, the first and second heavily doped regions being higher in impurity concentration than remaining portions of the first and second lightly doped regions.

DESCRIPTION OF THE PREFERRED EMBODIMENT

Prior-art semiconductor devices will be explained below for a better understanding of this invention.

Figure 1:
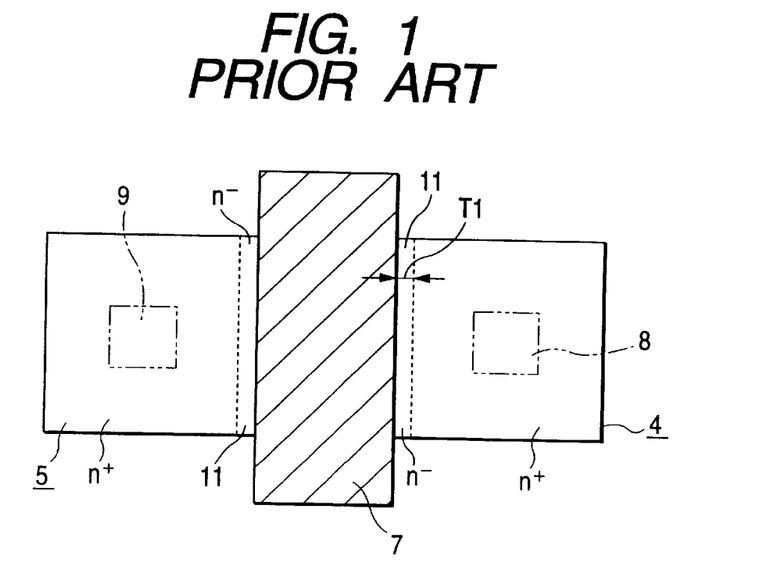
FIG. 1 is a plan view of a first prior-art MOS transistor.
Figure 2:
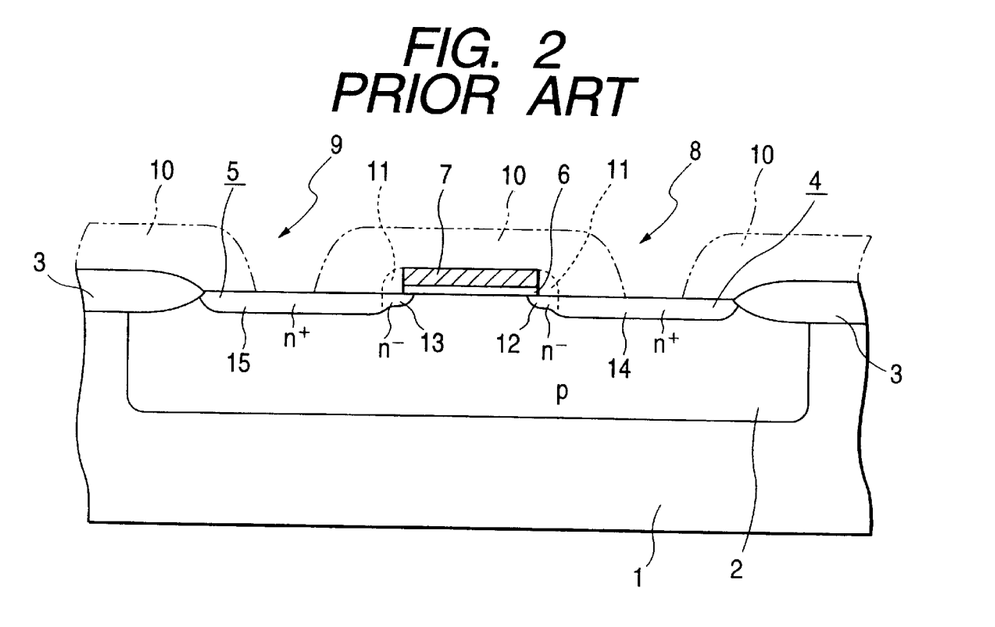
FIG. 2 is a sectional view of the prior-art MOS transistor in FIG. 1.

FIGS. 1 and 2 show a first prior-art MOS transistor disclosed in Japanese published unexamined patent application 9-69628. The prior-art MOS transistor of FIGS. 1 and 2 includes a semiconductor substrate 1 made of silicon which is formed with a p-type well 2 containing p-type impurity. The well 2 is electrically separated from neighboring MOS transistors (not shown) by a field oxide film 3. The field oxide film 3 corresponds to an element-separating (transistor-separating) region.

In the prior-art MOS transistor of FIGS. 1 and 2, an n-type drain region 4 and an n-type source region 5 are formed in a surface portion of the well 2. A gate oxide film 6 extends on the area of the surface of the well 2 between the drain region 4 and the source region 5. A gate electrode 7 is superimposed on the gate oxide film 6. Upper surfaces of the MOS transistor are covered by an inter-layer insulating film 10 made of $SiO_2$. The inter-layer insulating film 10 has contact holes 8 and 9. A portion of the drain region 4 is exposed at the bottom of the contact hole 8. A portion of the source region 5 is exposed at the bottom of the contact hole 9. Side walls 11 having a narrow width and composed of $SiO_2$ films are formed on opposite sides of the gate electrode 7, respectively. Lightly doped regions ($n^-$ regions) 12 and 13 extend below the side walls 11. The lightly doped regions 12 and 13 have a low impurity concentration.

During the fabrication of the prior-art MOS transistor of FIGS. 1 and 2, impurity ion implantation into the well 2 is executed under the presence of the side walls 11. The impurity ion implantation forms heavily doped regions ($n^+$ regions) 14 and 15 constituting effective portions (intrinsic portions) of the drain region 4 and the source region 5 respectively. The heavily doped regions 14 and 15 have a high impurity concentration. The side walls 11 serve as semi-masks during the impurity ion implantation. Thus, the side walls 11 cause the lightly doped regions 12 and 13 therebelow as a result of the impurity ion implantation. The lightly doped region 12 adjoins the heavily doped region 14 in the drain region 4. The lightly doped region 13 adjoins the heavily doped region 15 in the source region 5. The lightly doped region 12 extends between the transistor gate and the transistor drain. The lightly doped region 13 extends between the transistor gate and the transistor source.

During operation of the prior-art MOS transistor of FIGS. 1 and 2, the lightly doped region 12 reduces the strength of an electric field near the transistor drain, and thereby prevents a hot-carrier-caused decrease in transistor performances.

In the prior-art MOS transistor of FIGS. 1 and 2, the length (the width) of the lightly doped region 12 is determined by the thickness T1 of the side wall 11 extending thereabove. Accordingly, the length (the width) of the lightly doped region 12 is generally limited to about 0.3 $\mu$m. In the case where the prior-art MOS transistor of FIGS. 1 and 2 is used as a pixel switching element in a liquid crystal display, the limited length (the limited width) of the lightly doped region 12 causes a problem in reliability during operation at a high drive voltage, for example, 20 V.

In general, the prior-art MOS transistor of FIGS. 1 and 2 tends to be unable to withstand a high drive voltage, for example, 20 V.

Figure 3:
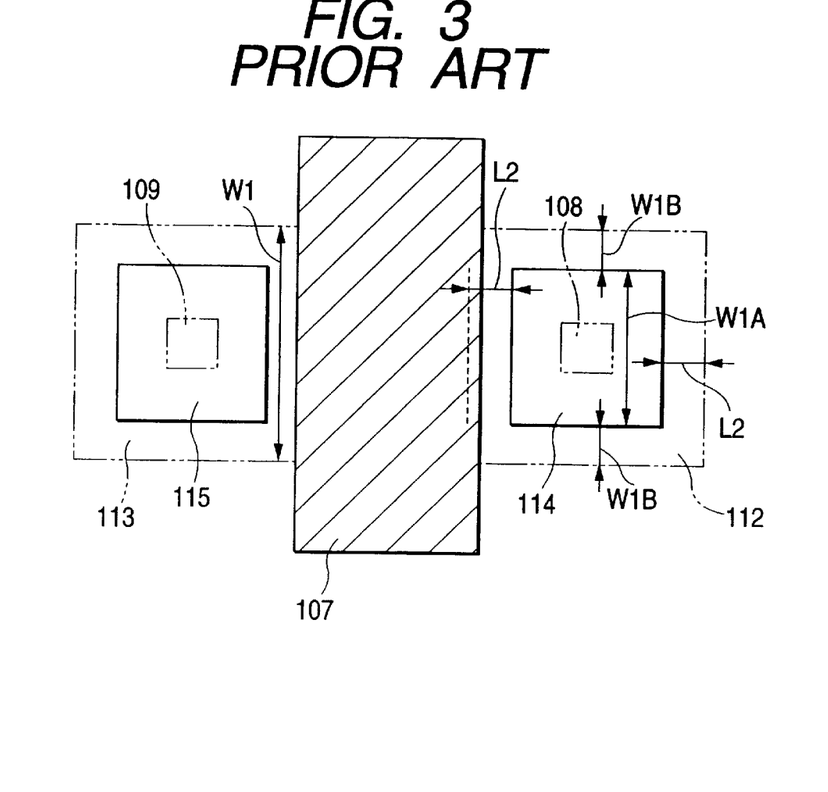
FIG. 3 is a plan view of a second prior-art MOS transistor.
Figure 4:
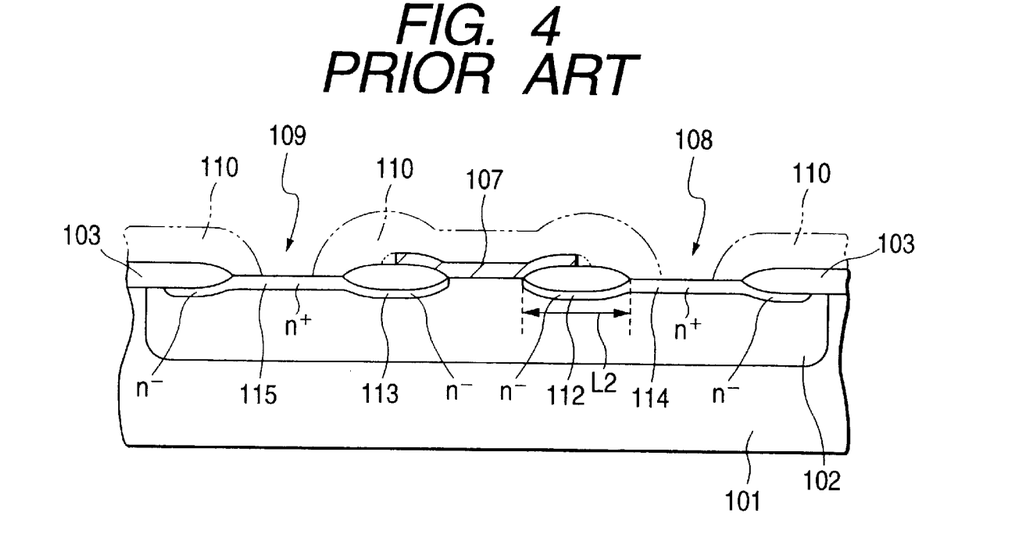
FIG. 4 is a sectional view of the prior-art MOS transistor in FIG. 3.

FIGS. 3 and 4 show a second prior-art MOS transistor having a drift channel structure. The prior-art MOS transistor of FIGS. 3 and 4 includes a semiconductor substrate 101 formed with a well 102. The well 102 is electrically separated from neighboring MOS transistors (not shown) by a field oxide film 103. The field oxide film 103 corresponds to an element-separating (transistor-separating) region.

In the prior-art MOS transistor of FIGS. 3 and 4, an n-type drain region 114 and an n-type source region 115 are formed in a surface portion of the well 102. A gate electrode 107 extends above the area of the surface of the well 102 between the drain region 114 and the source region 115. The field oxide film 103 has a first extra portion which extends between the gate electrode 107 and the drain region 114. The field oxide film 103 has a second extra portion which extends between the gate electrode 107 and the source region 115. Upper surfaces of the MOS transistor are covered by an inter-layer insulating film 110. The inter-layer insulating film 110 has contact holes 108 and 109. A portion of the drain region 114 is exposed at the bottom of the contact hole 108. A portion of the source region 115 is exposed at the bottom of the contact hole 109.

During the fabrication of the prior-art MOS transistor of FIGS. 3 and 4, impurity ion implantation into the well 102 is executed while the field oxide film 103 is used as a mask (a semi-mask). The impurity ion implantation forms heavily doped regions ($n^+$ regions) constituting the drain region 114 and the source region 115 respectively. The heavily doped regions have a high impurity concentration. The field oxide film 103 causes lightly doped regions ($n^-$ regions) therebelow as a result of the impurity ion implantation. The lightly doped regions include lightly doped regions 112 and 113 extending below the first and second extra portions of the field oxide film 103. The lightly doped region 112 adjoins the heavily doped region constituting the drain region 114. The lightly doped region 113 adjoins the heavily doped region constituting the source region 115. The lightly doped region 112 extends between the transistor gate and the transistor drain. The lightly doped region 113 extends between the transistor gate and the transistor source.

During operation of the prior-art MOS transistor of FIGS. 3 and 4, the lightly doped regions 112 and 113 enable the MOS transistor to withstand a high drive voltage. In general, such a high-rating-voltage transistor is suited to a pixel switching element in a liquid crystal display.

In the prior-art MOS transistor of FIGS. 3 and 4, the length (the width) L2 of the lightly doped regions 112 and 113 is determined by the width of the field oxide film 103 extending thereabove. The minimum width of the field oxide film 103 is approximately equal to twice the channel length. Thus, the length (the width) L2 of the lightly doped regions 112 and 113 is equal to about 2.4 $\mu$m or greater when the channel length is equal to about 1.2 $\mu$m. Such the lightly doped regions 112 and 113 of such a size cause the MOS transistor to be large.

In the prior-art MOS transistor of FIGS. 3 and 4, the effective width W1 of the gate electrode 107 is equal to the sum of the width W1A of the heavily doped region 114 and the twice the width W1B of the lightly doped region 112. Thus, the effective width W1 of the gate electrode 107 tends to be great.

Figure 5:
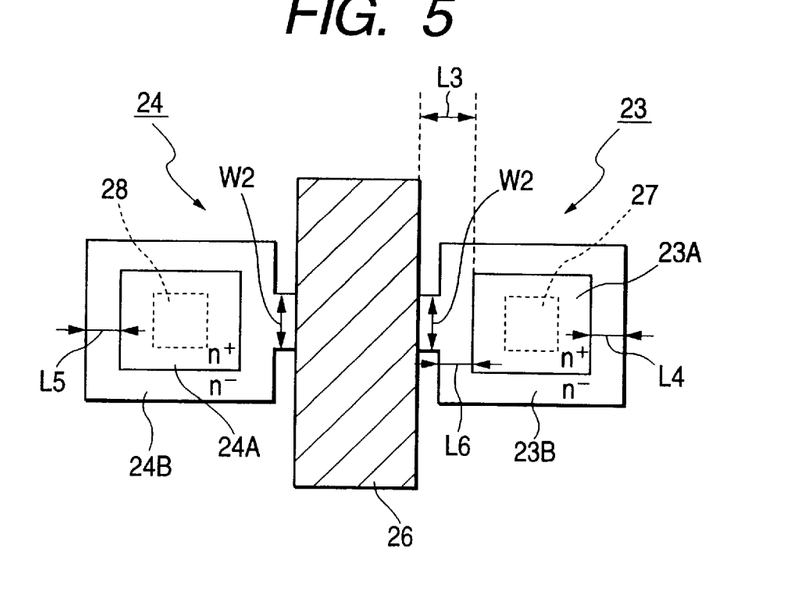
FIG. 5 is a plan view of a MOS transistor according to an embodiment of this invention.
Figure 6:
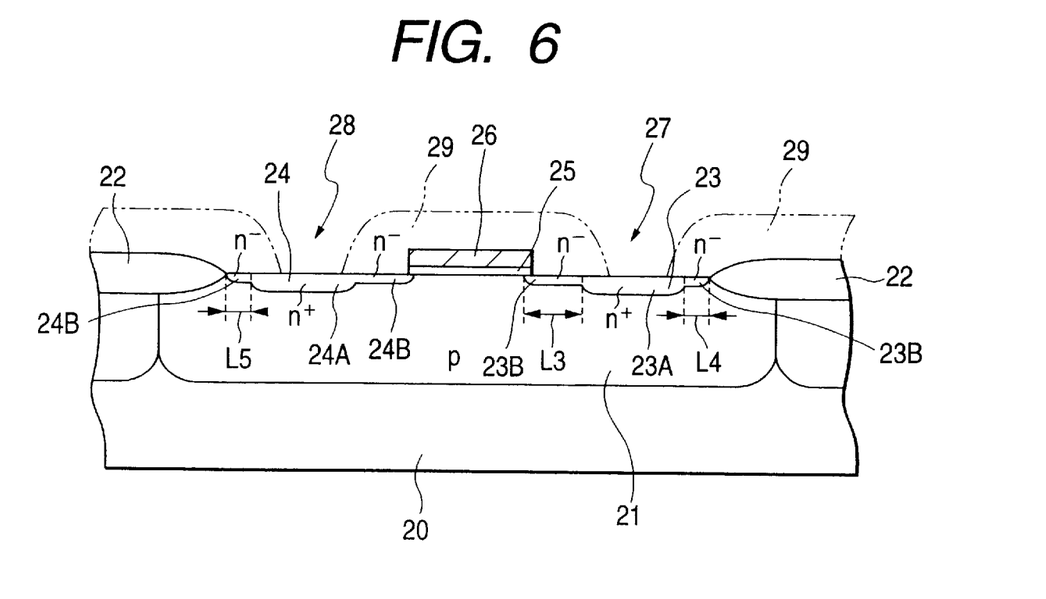
FIG. 6 is a sectional view of the MOS transistor in FIG. 5.

FIGS. 5 and 6 show a semiconductor device according to an embodiment of this invention. The semiconductor device of FIGS. 5 and 6 is a MOS transistor (a metal oxide semiconductor field-effect transistor). The MOS transistor in FIGS. 5 and 6 includes a semiconductor substrate 20 made of silicon which is formed with a p-type well 21 containing p-type impurity. The well 21 is electrically separated from neighboring MOS transistors (not shown) by a field oxide film 22. The field oxide film 22 corresponds to an element-separating (transistor-separating) region.

In the MOS transistor of FIGS. 5 and 6, an n-type drain region 23 and an n-type source region 24 are formed in a surface portion of the well 21. A gate oxide film 25 extends on the area of the surface of the well 21 between the drain region 23 and the source region 24. A gate electrode 26 is superimposed on the gate oxide film 25. Upper surfaces of the MOS transistor are covered by an inter-layer insulating film 29 made of SiO$_2$. The inter-layer insulating film 29 has contact holes 27 and 28. A portion of the drain region 23 is exposed at the bottom of the contact hole 27. A portion of the source region 24 is exposed at the bottom of the contact hole 28.

The drain region 23 has a heavily doped region (an n$^+$ region) 23A and a lightly doped region (an n$^-$ region) 23B. The heavily doped region 23A is surrounded by the lightly doped region 23B. The heavily doped region 23A has a high impurity concentration. The lightly doped region 23B has a low impurity concentration. Thus, the lightly doped region 23B is lower in impurity concentration than the heavily doped region 23A. The heavily doped region 23A extends at the bottom of the contact hole 27. The lightly doped region 23B extends around the heavily doped region 23A, and reaches a place directly below an edge of the gate electrode 26 and a place directly below an edge of the field oxide film 22.

The source region 24 has a heavily doped region (an n$^+$ region) 24A and a lightly doped region (an n$^-$ region) 24B. The heavily doped region 24A is surrounded by the lightly doped region 24B. The heavily doped region 24A has a high impurity concentration. The lightly doped region 24B has a low impurity concentration. Thus, the lightly doped region 24B is lower in impurity concentration than the heavily doped region 24A. The heavily doped region 24A extends at the bottom of the contact hole 28. The lightly doped region 24B extends around the heavily doped region 24A, and reaches a place directly below an edge of the gate electrode 26 and a place directly below an edge of the field oxide film 22.

As viewed from above, the lightly doped region 23B has approximately a rectangular loop shape. The lightly doped region 23B has a neck portion or a constricted portion extending between the loop and the place below the gate electrode 26. The neck portion (the constricted portion) has a predetermined width W2. Overlap between the lightly doped region 23B and the gate electrode 26 has a length-wise dimension equal to the width W2. The left-hand edge of the lightly doped region 23B below the gate electrode 26 is separated from the inner edge of the lightly doped region 23B in contact with the left-hand edge of the heavily doped region 23A by a predetermined distance (a predetermined length) L3. The right-hand edge of the lightly doped region 23B is separated from the inner edge of the lightly doped region 23B in contact with the right-hand edge of the heavily doped region 23A by a predetermined distance (a predetermined length) L4. The lefthand side portion of the lightly doped region 23B except the neck portion thereof has a predetermined width (a predetermined length) L6.

As viewed from above, the lightly doped region 24B has approximately a rectangular loop shape. The lightly doped region 24B has a neck portion or a constricted portion extending between the loop and the place below the gate electrode 26. The neck portion has the predetermined width W2. Overlap between the lightly doped region 24B and the gate electrode 26 has a length-wise dimension equal to the width W2. The left-hand edge of the lightly doped region 24B is separated from the inner edge of the lightly doped region 24B in contact with the left-hand edge of the heavily doped region 24A by a predetermined distance (a predetermined length) L5.

The dimensions L3, L4, L5, L6, and W2 are chosen to enable the MOS transistor to withstand a high drive voltage, and to allow only a small leak current in the MOS transistor.

Figure 7:
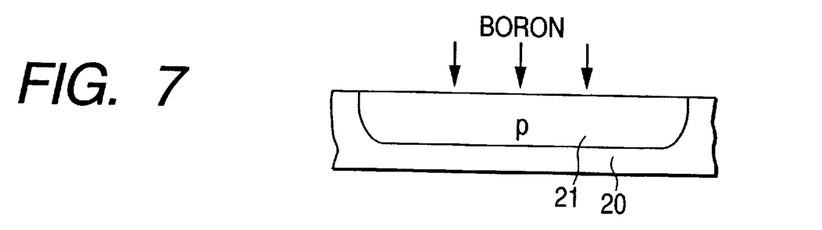
FIGS. 7, 8, 9, 10, 11, and 12 are sectional views of a semiconductor wafer in conditions which occur at different stages in the fabrication of the MOS transistor of FIG. 5.

The MOS transistor in FIGS. 5 and 6 is fabricated as follows. First, a semiconductor substrate 20 made of silicon is prepared. A resist is formed on a surface of the semiconductor substrate 20. The resist is shaped into a given pattern by photolithography. As shown in FIG. 7, boron ions are implanted into the semiconductor substrate 20 as impurity while the resist of the given pattern is used as a mask. The implantation of boron ions forms a p-type well 21 in the semiconductor substrate 20.

Figure 8:
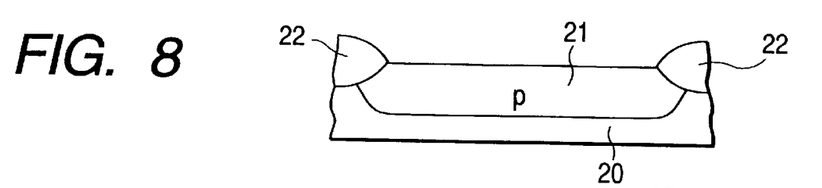

Next, as shown in FIG. 8, a transistor-separating field oxide film 22 made of SiO$_2$ is formed on portions of the semiconductor substrate 20 around the well 21 by LOCOS (local oxidation of silicon).

Figure 9:
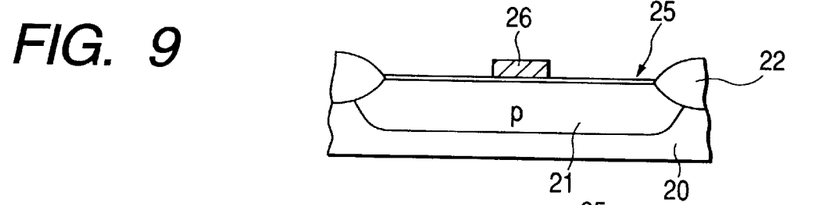

Then, as shown in FIG. 9, a gate oxide film 25 is formed on a surface of the well 21. The gate oxide film 25 has a predetermined small thickness. In addition, a gate electrode 26 is formed on the gate oxide film 25 by CVD (chemical vapor deposition) and photolithography, and etching technology.

It should be noted that the illustration of the gate oxide film 25 which extends in an area not directly below the gate electrode 26 is omitted from FIG. 6.

Figure 10:
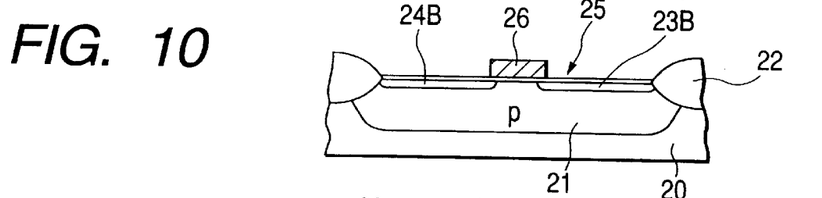

As shown in FIG. 10, n$^-$-type lightly doped regions 23B and 24B are formed by implanting phosphorus ions into a source-corresponding portion and a drain-corresponding portion of the well 21 at a small dose while using the gate electrode 26 and the field oxide film 22 as masks. The lightly doped regions 23B and 24B have a low impurity concentration.

Figure 11:
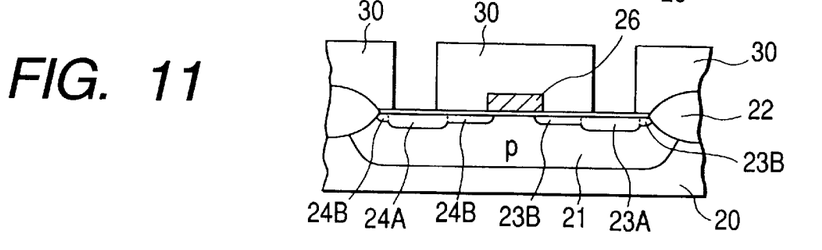

Subsequently, as shown in FIG. 11, a resist 30 having a given pattern is formed on the gate oxide film 25, the gate electrode 26, and the field oxide film 22 by photolithography. The resist 30 has holes. An effective-source-corresponding portion and an effective-drain-corresponding portion (an intrinsic-source-corresponding portion and an intrinsic-drain-corresponding portion) of the gate oxide film 25 are exposed at the bottoms of the holes in the resist 30. Central areas of the lightly doped regions 23B and 24B extend directly below the holes in the resist 30.

Then, n$^+$-type heavily doped regions 23A and 24A are formed by implanting phosphorus ions into the lightly doped regions 23B and 24B at a large dose while using the resist 30 as a mask. Thus, portions of the lightly doped regions 23B and 24B are changed into the heavily doped regions 23A and 24A respectively. The heavily doped regions 23A and 24A have an impurity concentration higher than that in the lightly doped regions 23B and 24B. The heavily doped regions 23A and 24A extend into the well 21 through the lightly doped regions 23B and 24B. The heavily doped region 23A is surrounded by the resultant lightly doped region (the remaining lightly doped region) 23B. The heavily doped region 24A is surrounded by the resultant lightly doped region (the remaining lightly doped region) 24B.

Figure 12:
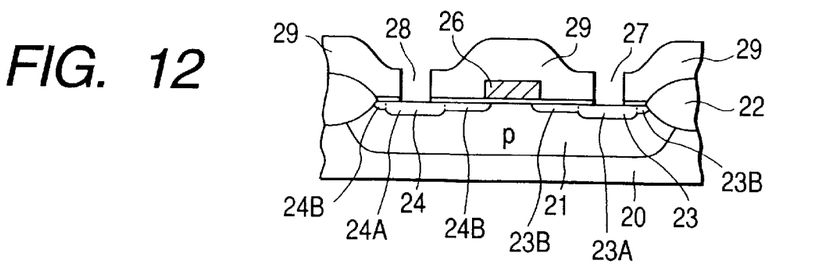

Next, as shown in FIG. 12, an inter-layer insulating film 29 is formed on the gate oxide film 25, the gate electrode 26, and the field oxide film 22. Contact holes 27 and 28 are formed in the inter-layer insulating film 29 and the gate oxide film 25 by photolithography and etching. The contact holes 27 and 28 vertically align with and extend above the heavily doped regions 23A and 24A, respectively. The heavily doped region 23A forms an effective drain region (an intrinsic drain region) 23 which is exposed at the bottom of the contact hole 27. The heavily doped region 24A forms an effective source region (an intrinsic source region) 24 which is exposed at the bottom of the contact hole 28. Then, the MOS transistor is completed.

In the MOS transistor of FIGS. 5 and 6, the length L3 of the portion of the lightly doped region 23B between the gate electrode 26 and the heavily doped region 23A is greater than that in a priorart MOS transistor. Thus, during operation of the MOS transistor, the lightly doped region 23B effectively reduces the strength of an electric field near the transistor drain, and hence decreases the number of generated hot electrons.

As shown in FIG. 5, the lightly doped region 23B between the gate electrode 26 and the heavily doped portion 23A is constricted as the neck portion having the small width W2. The constriction reduces the area of the overlap between the gate electrode 26 and the lightly doped region 23B. The reduced area of the overlap provides only a small leak current during operation of the MOS transistor.

Similarly, the lightly doped region 24B between the gate electrode 26 and the heavily doped portion 24A is constricted as the neck portion having the small width W2. The constriction reduces the area of the overlap between the gate electrode 26 and the lightly doped region 24B. The reduced area of the overlap provides only a small leak current during operation of the MOS transistor.

It is preferable to set the width W2 to about 1.0 μm in view of the leak current problem.

In the MOS transistor of FIGS. 5 and 6, the portion of the lightly doped region 23B which has the length L4 extends between the heavily doped region 23A and a right-hand side portion of the field oxide film 22. The portion of the lightly doped region 23B which has the length L6 extends between the heavily doped region 23A and a portion of the field oxide film 22 near the gate electrode 26. As best shown in FIG. 5, this portion of the lightly doped region 23B adjoins the heavily doped region 23A, and separates from the gate electrode 26 by a given distance in the horizontal direction.

The portion of the lightly doped region 24B which has the length L5 extends between the heavily doped region 24A and a left-hand side portion of the field oxide film 22. These portions of the lightly doped regions 23B and 24B enable the junctions in the MOS transistor to withstand a high voltage.

For example, the dimensions L3, L4, L5, L6 of the lightly doped regions 23B and 24B are equal to each other. The dimensions L3, L4, L5, L6 may be different from each other. In the case where the MOS transistor is operated at a drive voltage of 20 V, it is preferable to set the dimension L3 to about 1.5 μm in view of a hot-electron-caused problem, and to set the dimensions L4, L5, and L6 to about 1.0 μm in view of junction withstandingness against the drive voltage. Preferably, the dimension L3 is longer than the dimensions L4 and L5.

The MOS transistor of FIGS. 5 and 6 effectively suppresses or prevents the hot-electron-caused problem. In addition, the MOS transistor of FIGS. 5 and 6 provides only a small leak current. Accordingly, in the case where the MOS transistor is used as a pixel switching element in a liquid crystal display, a related hold capacitor can be small in size.

It should be noted that the p-type well 21 may be replaced by an n-type well. In this case, the conductivity type of the transistor drain and the transistor source is changed to the p-type.

Figure 13:
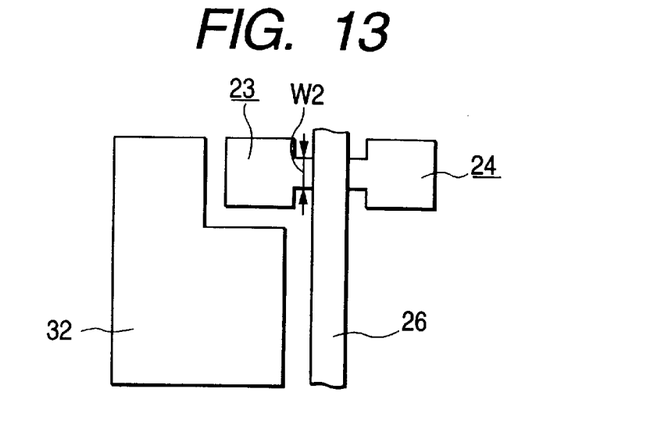
FIG. 13 is a diagram of a portion of a liquid crystal display in which a pixel switching element uses the MOS transistor in FIG. 5.

FIG. 13 shows a portion of a liquid crystal display in which each pixel switching element uses the MOS transistor of FIGS. 5 and 6. As shown in FIG. 13, the MOS transistor, that is, the pixel switching element, includes the drain region 23, the source region 24, and the gate electrode 26. The drain region 23 is electrically connected to a hold capacitor 32. The hold capacitor 32 is connected to a pixel electrode (not shown).

Figure 14:
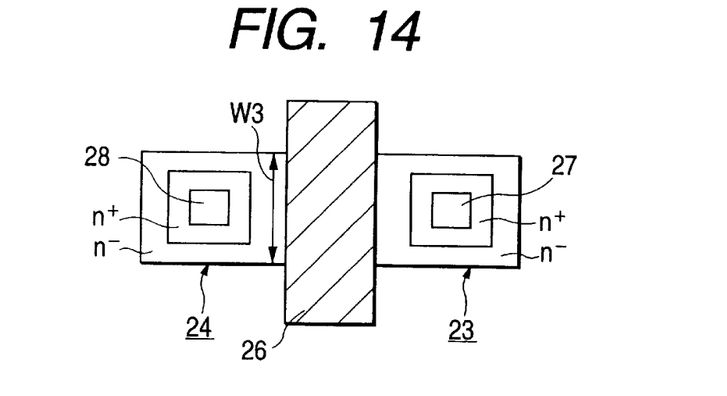
FIG. 14 is a plan view of a MOS transistor which is a modification of the MOS transistor in FIG. 5.

FIG. 14 shows a modification of the MOS transistor of FIGS. 5 and 6. According to the modification in FIG. 14, the neck portions are omitted from the lightly doped regions 23B and 24B (see FIG. 5). Thus, in the modification, the lightly doped regions overlap the gate electrode 26 by a width W3 greater than the width W2 (see FIGS. 5 and 13). Therefore, the modification in FIG. 14 tends to provide a leak current greater than that in the MOS transistor of FIGS. 5 and 6.

Figure 15:
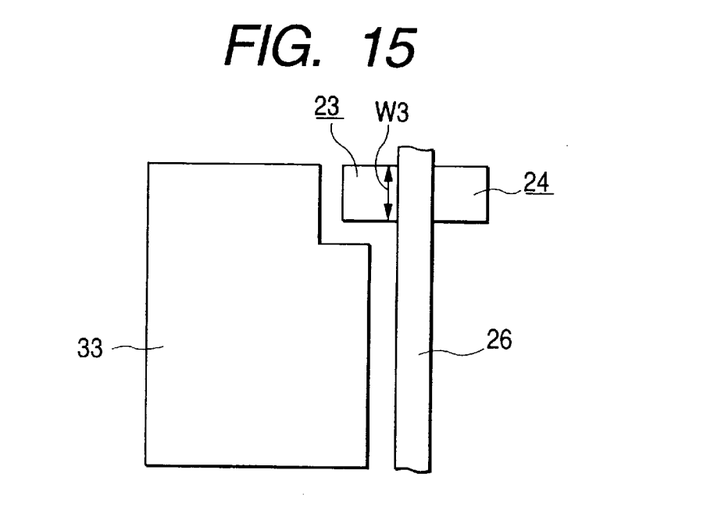
FIG. 15 is a diagram of a portion of a liquid crystal display in which a pixel switching element uses the MOS transistor in FIG. 14.

FIG. 15 shows a portion of a liquid crystal display in which each pixel switching element uses the MOS transistor of FIG. 14. As shown in FIG. 15, the MOS transistor, that is, the pixel switching element, includes the drain region 23, the source region 24, and the gate electrode 26. The drain region 23 is electrically connected to a hold capacitor 33. The hold capacitor 33 is connected to a pixel electrode (not shown). Preferably, the size of the hold capacitor 33 is greater than that of the hold capacitor 32 in FIG. 13.

What is claimed is:

1. A semiconductor device comprising:
    a semiconductor substrate;
    a gate electrode formed on the semiconductor substrate;
    a drain region formed on the semiconductor substrate; and
    an element separating region formed on the semiconductor substrate;
    wherein the drain region includes a heavily doped region and a lightly doped region, the heavily doped region being higher in impurity concentration than the lightly doped region, the lightly doped region having a first portion extending between the gate electrode and the heavily doped region, the lightly doped region having a second portion extending between the element separating region and the heavily doped region; and
    wherein as viewed from above, the first portion of the lightly doped region has a neck portion extending between the gate electrode and a rest of the first portion of the lightly doped region.

2. A semiconductor device as recited in claim 1, wherein the first portion of the lightly doped region and the second portion of the lightly doped region are different in length.

3. A semiconductor device comprising:
    a semiconductor substrate;
    a gate electrode formed on the semiconductor substrate;
    a source region formed on the semiconductor substrate; and
    an element separating region formed on the semiconductor substrate;
    wherein the source region includes a heavily doped region and a lightly doped region, the heavily doped region being higher in impurity concentration than the lightly doped region, the lightly doped region having a first portion extending between the gate electrode and the heavily doped region, the lightly doped region having a second portion extending between the element separating region and the heavily doped region; and wherein as viewed from above, the first portion of the lightly doped region has a neck portion extending between the gate electrode and a rest of the first portion of the lightly doped region.

4. A semiconductor device as recited in claim 3, wherein the first portion of the lightly doped region and the second portion of the lightly doped region are different in length.

5. A semiconductor device comprising:

a semiconductor substrate;

a gate electrode formed on the semiconductor substrate; and a drain region formed on the semiconductor substrate;

wherein the drain region includes a heavily doped region and a lightly doped region, the heavily doped region being higher in impurity concentration than the lightly doped region, the lightly doped region having a first portion extending between the gate electrode and the heavily doped region; and wherein as viewed from above, the first portion of the lightly doped region has a neck portion and a shoulder portion, the neck portion extending between the gate electrode and the shoulder portion, the shoulder portion being spaced from the gate electrode and adjoining the heavily doped region, the neck portion being smaller than the shoulder portion in a dimension parallel to a related edge of the gate electrode.

6. A semiconductor device comprising:

a semiconductor substrate;

a gate electrode formed on the semiconductor substrate;

and a source region formed on the semiconductor substrate;

wherein the source region includes a heavily doped region and a lightly doped region, the heavily doped region being higher in impurity concentration than the lightly doped region, the lightly doped region having a first portion extending between the gate electrode and the heavily doped region; and wherein as viewed from above, the first portion of the lightly doped region has a neck portion and a shoulder portion, the neck portion extending between the gate electrode and the shoulder portion, the shoulder portion being spaced from the gate electrode and adjoining the heavily doped region, the neck portion being smaller than the shoulder portion in a dimension parallel to a related edge of the gate electrode.

7. A semiconductor device comprising:

a semiconductor substrate;

a gate electrode formed on the semiconductor substrate; and a drain region formed on the semiconductor substrate;

wherein the drain region includes a heavily doped region and a lightly doped region, the heavily doped region being higher in impurity concentration than the lightly doped region, the lightly doped region having a first portion and a neck portion; and wherein as viewed from above, the first portion of the lightly doped region surrounds the heavily doped region and spaced from the gate electrode, and the neck portion of the lightly doped region extends between the gate electrode and the first portion thereof.

8. A semiconductor device comprising:

a semiconductor substrate;

a gate electrode fanned on the semiconductor substrate; and a source region fanned on the semiconductor substrate;

wherein the source region includes a heavily doped region and a lightly doped region, the heavily doped region being higher in impurity concentration than the lightly doped region, the lightly doped region having a first portion arid a neck portion; and wherein as viewed from above, the first portion of the lightly doped region surrounds the heavily doped region and is spaced from the gate electrode, and the neck portion of the lightly doped region extends between the gate electrode and the first portion thereof.

* * * * *